United States Patent [19]

Murakami

[11] Patent Number: 5,767,745

[45] Date of Patent: Jun. 16, 1998

[54] SOLID RESONATOR BASED OSCILLATOR HAVING A PHASE CONTROL CIRCUIT

[75] Inventor: Sadakazu Murakami, Kyoto, Japan

[73] Assignee: Rohm Co., Ltd., Kyoto, Japan

[21] Appl. No.: 687,172

[22] Filed: Jul. 25, 1996

[30] Foreign Application Priority Data

Jul. 31, 1995 [JP] Japan ................. 7-194890

[51] Int. Cl.[6] .................. H03B 5/36; H03L 7/099
[52] U.S. Cl. .................. 331/8; 331/25; 331/34; 331/116 R; 331/117 R
[58] Field of Search .................. 331/8, 25, 34, 331/116 R, 116 FE, 158, 177 R

[56] References Cited

U.S. PATENT DOCUMENTS 4,128,817 12/1978 Gomi .................. 331/116 R

*Primary Examiner*—Siegfried H. Grimm
*Attorney, Agent, or Firm*—Nikaido, Marmelstein, Murray & Oram LLP

[57] ABSTRACT

An oscillator circuit having a phase control circuit performing phase control on the oscillation signal based on a signal representing a phase difference between a signal input from outside and the oscillation output so that the oscillation frequency follows the frequency variation of the signal input from outside. The phase control circuit includes a phase shifting circuit for forming the oscillation signal into first and second signals having a phase, difference of approximately 45°. The phase control circuit subtracts the second signal from the first signal vectorially to form a third signal, and also inverts the second signal to form a fourth signal. Depending on the level of the phase difference signal, the phase control circuit outputs a composite signal of either the second and third or the third and fourth signals.

5 Claims, 3 Drawing Sheets

5,767,745

1

SOLID RESONATOR BASED OSCILLATOR HAVING A PHASE CONTROL CIRCUIT

BACKGROUND OF THE INVENTION

1. Field of the Invention

The present invention relates to an oscillator circuit using a solid resonator such as a quartz crystal resonator.

2. Description of the Prior Art

In an oscillator circuit using a quartz crystal resonator, the oscillation frequency is made to follow the variation in frequency of an external signal by controlling the phase of the oscillation signal based on the phase difference between the oscillation signal and the external signal. This enables the oscillator circuit to shift its frequency from a free-run frequency to a particular frequency. In conventional oscillator circuits, the range of such phase control is generally ±45°, or from 0° to 90°.

In a conventional oscillator circuit, which has a relatively narrow range of phase control as described above, if the free-run frequency is deviated extremely because of the deviation of the quartz crystal resonator, the frequency difference between the oscillation signal and the external signal may be too great for the phase control to follow substantially. For this reason, it is essential, in a conventional oscillator circuit, to adjust the free-run frequency in advance. However, such adjustment is desirably dispensed with, since it increases production costs.

SUMMARY OF THE INVENTION

An object of the present invention is to provide a solid resonator based oscillator circuit whose oscillation frequency is variable in a wide range.

According to the present invention, a solid resonator based oscillator circuit which performs phase control on the oscillation signal based on a signal representing a phase difference between a signal input from outside and the oscillation output in order to make the oscillation frequency follow the frequency variation of the signal input from outside is characterized in that a circuit performing the phase control comprises: means for forming said oscillation signal into first and second signals having a phase difference of about 45 degrees therebetween; means for forming a third signal by vectorially subtracting the second signal from the first signal; means for forming a fourth signal by inverting the second signal; and composite output means for outputting either a composite signal of the second and third signals or a composite signal of the third and fourth signals depending on said phase difference signal.

In this construction, supposing that the phase of the second signal is 0°, the third signal is produced at 90°, the composite output of the second and third signals is produced between 0° and 90°, and the composite output of the third and fourth signals is produced between 90° and 180°. Accordingly, the signal representing the phase difference between the oscillation signal and the external signal changes according as the level of the phase control signal changes, making the phase of the oscillation signal change between 0° and 180°.

BRIEF DESCRIPTION OF THE DRAWINGS

This and other objects and features of this invention will become clear from the following description, taken in conjunction with the preferred embodiments with reference to the accompanied drawings in which.

2

Figure 2:
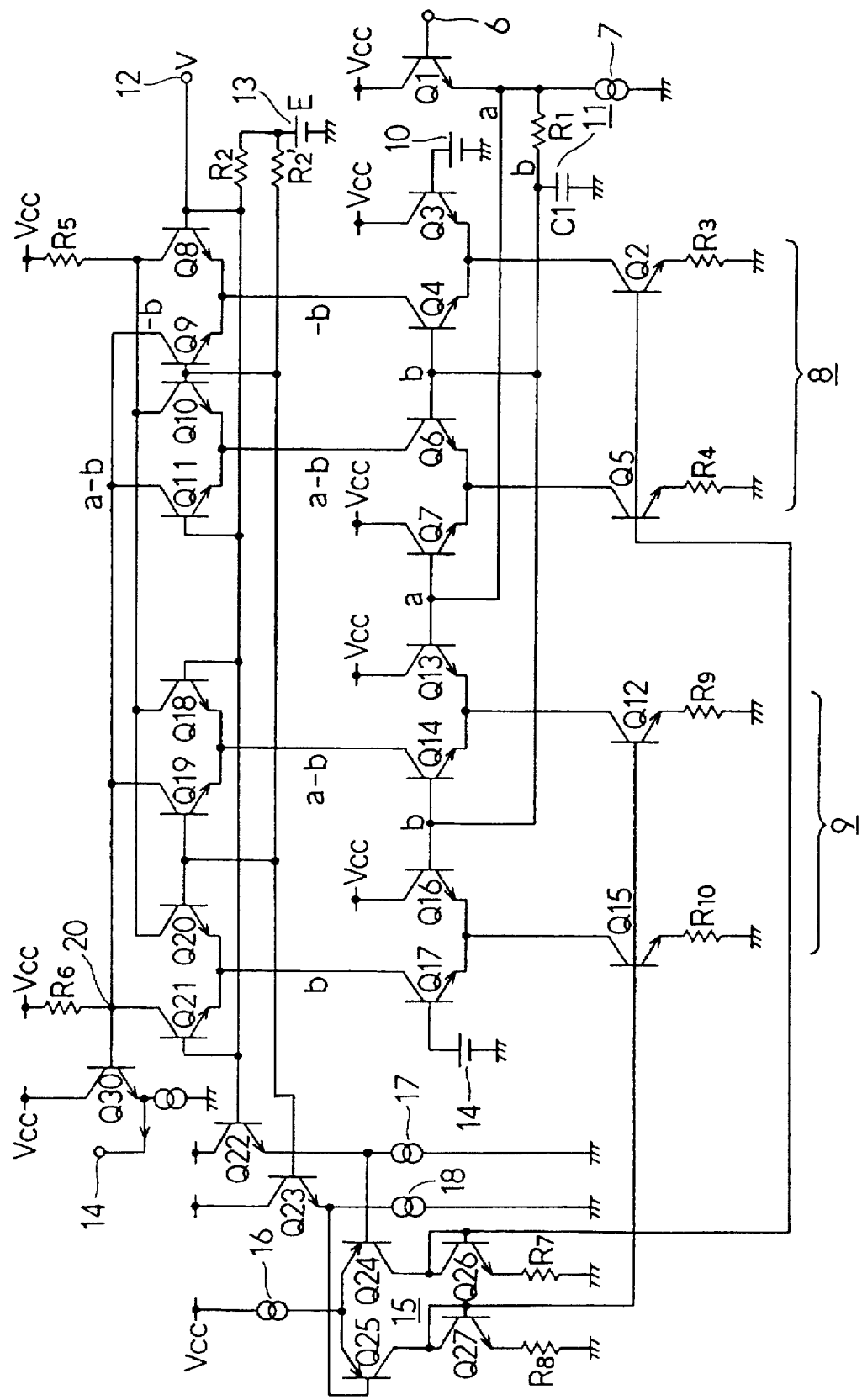
Figure 3:
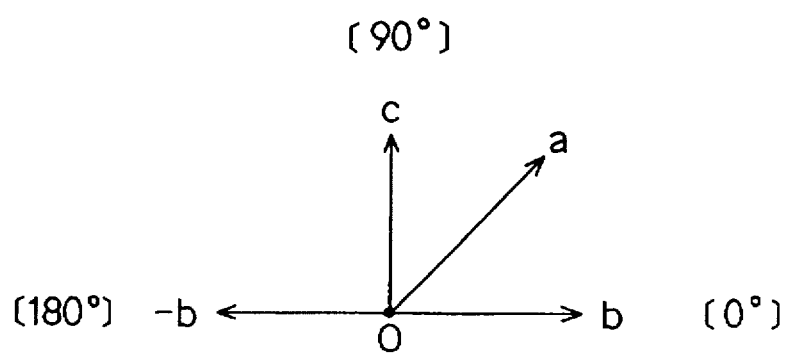

FIG. 2 is a circuit diagram showing the phase control circuit of the oscillator circuit; and FIG. 3 is a diagram showing vectors representing the signals appearing in the oscillator circuit.

DESCRIPTION OF THE PREFERRED EMBODIMENTS

Figure 1:
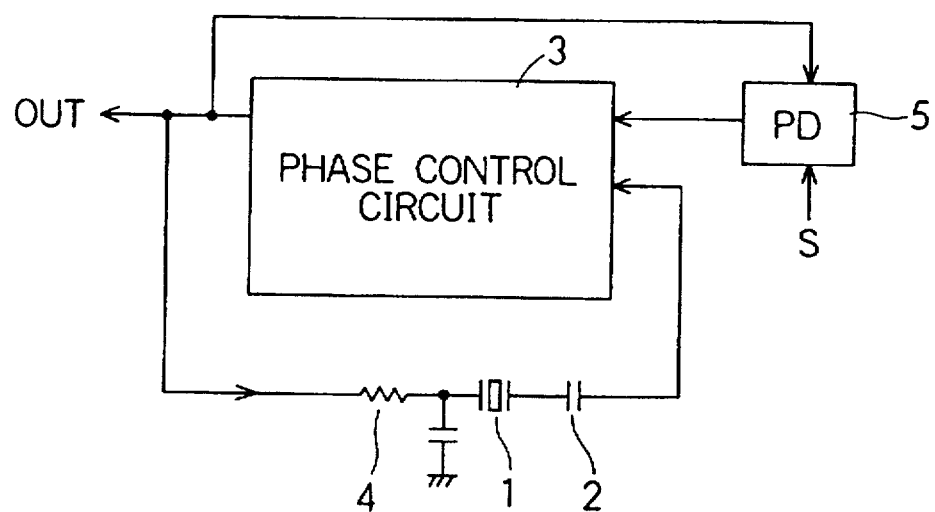
FIG. 1 is a block circuit diagram showing an oscillator circuit embodying the present invention.

Hereinafter, an embodiment of the present invention will be described with reference to the drawings. FIG. 1 is a block diagram showing the outline of this embodiment. Reference numeral 1 represents a quartz crystal resonator, reference numeral 2 represents a coupling capacitor, reference numeral 3 represents a phase control circuit, and reference numeral 4 represents a phase shifting circuit. Reference numeral 5 represents a phase detector for comparing an oscillation signal having passed through the phase control circuit 3 with an external signal S. Based on the output of the phase detector 5 (a phase difference signal), the phase control circuit 3 performs phase control. The oscillation signal having a phase thus controlled is fed back to the quartz crystal resonator 1.

This construction as shown in FIG. 1 enables the frequency of the oscillation output (OUT) to follow the frequency of the external signal S. In this embodiment, the phase control circuit 3 is, as described below, so constructed as to be capable of controlling the phase between 0° and 180°. FIG. 2 shows a concrete construction of the phase control circuit 3. In the figure, reference numeral 6 represents a terminal to which the oscillation signal of the quartz crystal resonator 1 is supplied. This terminal 6 is connected to the base of a transistor Q1 serving as a buffer.

The transistor Q1 has its collector connected to a power source voltage Vcc, and its emitter connected to a constant current source 7. Reference numeral 8 represents a first phase control circuit, and reference numeral 9 represents a second phase control circuit. These two phase control circuits have the same construction, and, in principle, only one of the two is operative at a time, leaving the other inoperative. However, both may be operative at the same time in a certain case (on the boundary between the operative and inoperative states).

First, the construction of the first phase control circuit 8 will be described below. A transistor Q2 and a resistor R3 form a current source; similarly, a transistor Q5 and a resistor R4 form another current source. The collector of the transistor Q2 is connected to the emitters of transistors Q3 and Q4 which form a differential connected pair; similarly, the collector of the transistor Q5 is connected to the emitters of transistors Q6 and Q7 which form another differential connected pair. The base of the transistor Q3 is connected to a direct-current power source 10; the base of the transistor Q7 is directly connected to the emitter of the transistor Q1 serving as a buffer.

On the other hand, the bases of the transistors Q4 and Q6 are connected to a phase shifting circuit 11. The phase shifting circuit 11 shifts by 45° the oscillation signal delivered to the emitter of the transistor Q1. Suppose here the oscillation signal whose phase is not shifted is a, and the oscillation signal whose phase is shifted is b. The collector of the transistor Q7 is connected to the direct-current power source voltage Vcc in the same way as the collector of the transistor Q3.

The collector of the transistor Q4 is connected to the emitters of transistors Q8 and Q9 which form a differential connected pair; similarly, the collector of the transistor Q6 is connected to the emitters of transistors Q10 and Q11 which form a differential connected pair. The bases of the transistors Q8 and Q11 are connected to a terminal 12. To this terminal 12, a control signal is supplied from the phase detector 5 shown in FIG. 1. The bases of the transistors Q9 and Q10 are connected, through a resistor R2', to a direct-current power source 13.

The bases of the transistors Q8 and Q11 are also connected, through a resistor R2, to the direct-current power source 13. The collectors of the transistors Q8 and Q10 are connected to a resistor R5; the collectors of the transistors Q9 and Q11 are connected to an output resistor R6. The other ends of the resistors R5 and R6 are both connected to the direct-current power source Vcc. Next, the second phase control circuit 9 will be described below, although details will not be given since it has a construction similar to that of the above described first phase control circuit 8. The signal output from the phase control circuit 3 shown in FIG. 2 appears at a connection 20 between the output resistor R6 and the collectors of the transistors Q9, Q11, Q19 and Q21, and is delivered through a transistor Q30 to a terminal 14.

In the second phase control circuit 9, the base of a transistor Q17 is connected to a direct-current power source 14. The direct-current power source 14 has the same voltage as the direct-current power source 10. The base of a transistor Q13 is directly connected to the emitter of the transistor Q1, and the bases of transistors Q14 and Q16 are connected to the phase shifting circuit 11. Moreover, the collectors of transistors Q18 and Q20 are connected to the resistor R5, and the collectors of transistors Q19 and Q21 are connected to the resistor R6. The bases of the transistors Q18 and Q21 are connected to the terminal 12; the bases of the transistors Q19 and Q20 are connected, through the resistor R2', to the direct-current power source 13.

The voltage appearing at the resistor R6 (the voltage at a node 20) is delivered, through a transistor Q30 serving as a buffer, to the output terminal. The output terminal 14 is connected to a phase shifting circuit 4 shown in FIG. 1. One end of the resistor R2 and one end of the resistor R2' are both connected, through transistors Q22 and Q23 serving as buffers, to a differential circuit 15.

The differential circuit 15 is composed of pnp-type transistors Q24 and Q25, and a constant current source 16. The transistors Q24 and Q25 have their collectors connected respectively to transistors Q26 and Q27, which are themselves so connected as to function as diodes. These transistors Q26 and Q27 serve as input-stage transistors of a current mirror circuit.

Specifically, the transistor Q26, together with transistors Q2 and Q5, forms a current mirror circuit to drive the transistors Q2 and Q5, whereas the transistor Q27, together with transistors Q12 and Q15, forms a current mirror circuit to drive the transistors Q12 and Q15.

Next, an operation of the circuit shown in FIG. 2 will be described. First, suppose the control voltage V supplied to the terminal 12 is lower than the voltage E of the direct-current power source 13. In this case, the emitter current of the transistor Q23 supplies all the current for the constant current source 18, turning off the transistor Q25. On the other hand, because the emitter current of the transistor Q22 is lower than the current of the constant current source 17, a base current flows through the transistor Q24, turning on the transistor Q24.

This makes the transistors Q2 and Q5 on, and the transistors Q12 and Q15 off. As a result, the second phase control circuit 9 becomes inoperative, whereas the first phase control circuit 8 becomes operative (this is a first mode). Here, in the first phase control circuit 8, a signal —b appears at the collector of the transistor Q4, and a signal a–b appears at the collector of the transistor Q6.

The signal a–b corresponds to the signal c shown in the vector diagram of FIG. 3. The signal c passes through the transistor Q11 to be output at its collector. On the other hand, the signal —b, which appears at the collector of the transistor Q4, passes through the transistor Q9 to be output at its collector. As a result, a composite output of the signals —b and c appears at the output terminal 14. The composite output, if shown in FIG. 3, falls within the range between 90° and 180°. In other words, the phase of the composite output can be controlled in the range between 90° and 180°.

Next, in contrast to the above description, when V is higher than E, the first phase control circuit 8 becomes inoperative, whereas the second phase control circuit 9 becomes operative (this is a second mode). In this case, a signal a–b (=c) appearing at the output of the transistor Q14 is delivered through the transistor Q19, and a signal b appearing at the collector of the transistor Q17 is delivered through the transistor Q21, producing a composite output of the signals b and c. The composite output, if shown in FIG. 3, falls within the range between 0° and 90°. Next, when V is equal to E, the first and second phase control circuit are both turned on at the same time, producing a composite output of 2c, whose phase falls on 90°.

As described above, according to the present invention, an oscillator can be controlled substantially in the range between 0° and 180°, which is a range twice as wide as the range of a conventional oscillator circuit. Accordingly, the oscillator circuit can follow the frequency variation of an external signal S in a wider range. As a result, even if the free run frequency is deviated because of a deviated quartz crystal resonator, such deviations can be neglected. This conveniently eliminates the need of adjusting the oscillator circuit beforehand.

What is claimed is:

1. An oscillator device comprising:
   an oscillator unit having a solid resonator;
   a phase control circuit for performing phase control of an oscillation signal;
   a phase comparator for comparing phases between an output of the phase control circuit and a signal input from outside to supply a comparison output as a phase control signal to the phase control circuit;
   wherein said phase control circuit comprises:
   means for forming the oscillation signal into first and second signals having a phase difference of approximately 45° from each other;
   first and second transistors whose emitters are connected to a first current source;
   means for producing an inversion of the second signal at a collector of the second transistor;
   third and fourth transistors whose emitters are connected to the collector of the second transistor;
   fifth and sixth transistors whose emitters are connected to a second current source;
   means for coupling the second signal to a base of the fifth transistor and the first signal to a base of the sixth transistor to output at a collector of the fifth transistor a signal obtained by vectorially subtracting the second signal from the first signal;
   seventh and eight transistors whose emitters are connected to the collector of the fifth transistor;
   ninth and tenth transistors whose emitters are connected to a third current source;

means for coupling the first signal to a base of the ninth transistor and the second signal to a base of the tenth transistor to output at a collector of the tenth transistor a signal obtained by vectorially subtracting the second signal from the first signal;

eleventh and twelfth transistors whose emitters are connected to the collector of the tenth transistor;

thirteen and fourteenth transistors whose emitters are connected to a fourth current source;

means for making the second signal be output at a collector of the fourteenth transistor;

fifteenth and sixteenth transistors whose emitters are connected to the collector of the fourteenth transistor;

means for collectively connecting collectors of said fourth, eighth, twelfth, and sixteenth transistors to a power source line through an output resistor; and mode forming means for establishing either a mode in which the first and second current sources are operative and the third and fourth current sources are inoperative or a mode in which the first and second current sources are inoperative and the third and fourth current sources are operative depending on whether said phase difference signal is higher or lower than a predetermined voltage.

2. An oscillator device as claimed in claim 1, wherein the solid resonator is a quartz crystal resonator.

3. An oscillator circuit which performs phase control on its oscillation signal based on a signal representing a phase difference between a signal input from outside and an oscillation output so that oscillation frequency follows frequency variation of said signal input from outside, wherein a circuit for performing said phase control comprises:

means for forming the oscillation signal into first and second signals having a phase difference of approximately 45° from each other;

first and second transistors whose emitters are connected to a first current source;

means for producing an inversion of the second signal at a collector of the second transistor;

third and fourth transistors whose emitters are connected to the collector of the second transistor;

fifth and sixth transistors whose emitters are connected to a second current source;

means for coupling the second signal to a base of the fifth transistor and the first signal to a base of the sixth transistor to output at a collector of the fifth transistor a signal obtained by vectorially subtracting the second signal from the first signal;

seventh and eighth transistors whose emitters are connected to the collector of the fifth transistor;

ninth and tenth transistors whose emitters are connected to a third current source;

means for coupling the first signal to a base of the ninth transistor and the second signal to a base of the tenth transistor to output at a collector of the tenth transistor a signal obtained by vectorially subtracting the second signal from the first signal;

eleventh and twelfth transistors whose emitters are connected to the collector of the tenth transistor;

thirteenth and fourteenth transistors whose emitters are connected to a fourth current source;

means for making the second signal be output at a collector of the fourteenth transistor;

fifteenth and sixteenth transistors whose emitters are connected to the collector of the fourteenth transistor;

means for collectively connecting collectors of said fourth, eighth, twelfth, and sixteenth transistors to a power source line through an output resistor; and mode forming means for establishing either a mode in which the first and second current sources are operative and the third and fourth current sources are inoperative or a mode in which the first and second current sources are inoperative and the third and fourth current sources are operative depending on whether said phase difference signal is higher or lower than a predetermined voltage.

4. An oscillator circuit as claimed in claim 3, further comprising:

means for coupling said predetermined voltage to bases of the third, eighth, eleventh, and sixteenth transistors through a first resistor;

means for coupling said predetermined voltage to bases of the fourth, seventh, twelfth, and fifteenth transistors through a second resistor; and means for coupling the phase difference signal to the bases of the third, eighth, eleventh, and sixteenth transistors.

5. An oscillator circuit as claimed in claim 4, wherein said mode forming means is provided with a pair of differentially connected transistors, which are controlled by a voltage difference between a voltage supplied to their bases through the first and second resistors from said predetermined voltage and the phase difference signal in order to produce a mode forming signal.

* * * * *